United States Patent
Calmels

(10) Patent No.: US 9,187,187 B2
(45) Date of Patent: Nov. 17, 2015

(54) METHOD OF CALCULATING DYNAMIC PRESSURE AT THE LEVEL OF AN AIRCRAFT SURFACE

(71) Applicant: AIRBUS OPERATIONS (S.A.S), Toulouse (FR)

(72) Inventor: Benoit Calmels, Toulouse (FR)

(73) Assignee: AIRBUS OPERATIONS SAS, Toulouse (FR)

( * ) Notice: Subject to any disclaimer, the term of this patent is extended or adjusted under 35 U.S.C. 154(b) by 382 days.

(21) Appl. No.: 13/661,958

(22) Filed: Oct. 26, 2012

(65) Prior Publication Data
US 2013/0191087 A1 Jul. 25, 2013

(30) Foreign Application Priority Data
Oct. 28, 2011 (FR) .................................... 11 59838

(51) Int. Cl.
*B64F 5/00* (2006.01)
*G06F 17/50* (2006.01)
*G01M 9/06* (2006.01)

(52) U.S. Cl.
CPC .. *B64F 5/00* (2013.01); *G01M 9/06* (2013.01); *G06F 17/5009* (2013.01); *G06F 17/5095* (2013.01)

(58) Field of Classification Search
CPC . G06F 17/50; G06F 2217/16; G06F 17/5095; G06F 17/5018; G06F 17/5009; G01M 9/06; B64F 5/00
See application file for complete search history.

(56) References Cited

U.S. PATENT DOCUMENTS

| 2004/0033473 A1* | 2/2004 | Cooke .............................. 434/45 |
| 2008/0140359 A1* | 6/2008 | Narramore et al. ................ 703/1 |
| 2009/0112502 A1 | 4/2009 | Albelda |
| 2010/0268517 A1* | 10/2010 | Calmels ............................ 703/8 |
| 2010/0280802 A1* | 11/2010 | Calmels ............................ 703/2 |
| 2010/0312497 A1 | 12/2010 | Rabadan |

FOREIGN PATENT DOCUMENTS

JP 2010-243309 10/2010

OTHER PUBLICATIONS

French Search Report dated Jul. 2, 2012.

* cited by examiner

*Primary Examiner* — Kamini S Shah
*Assistant Examiner* — David J Hofer
(74) *Attorney, Agent, or Firm* — Dickinson Wright PLLC

(57) ABSTRACT

The invention is aimed at a method simulating the aerodynamic flow around an aircraft, so as to detect the aerodynamic loads exerted on a predetermined surface of the aircraft. The method includes a phase of determining a value denoted QA of global dynamic pressure at the level of the predetermined surface of the aircraft. The method includes steps of carrying out simulations of aerodynamic flow around the predetermined surface of the aircraft for given environmental conditions, on the basis of a mesh produced around the shape of the aircraft, determining a local dynamic pressure qA around the predetermined surface of the aircraft, and then calculating the global dynamic pressure QA.

8 Claims, 1 Drawing Sheet

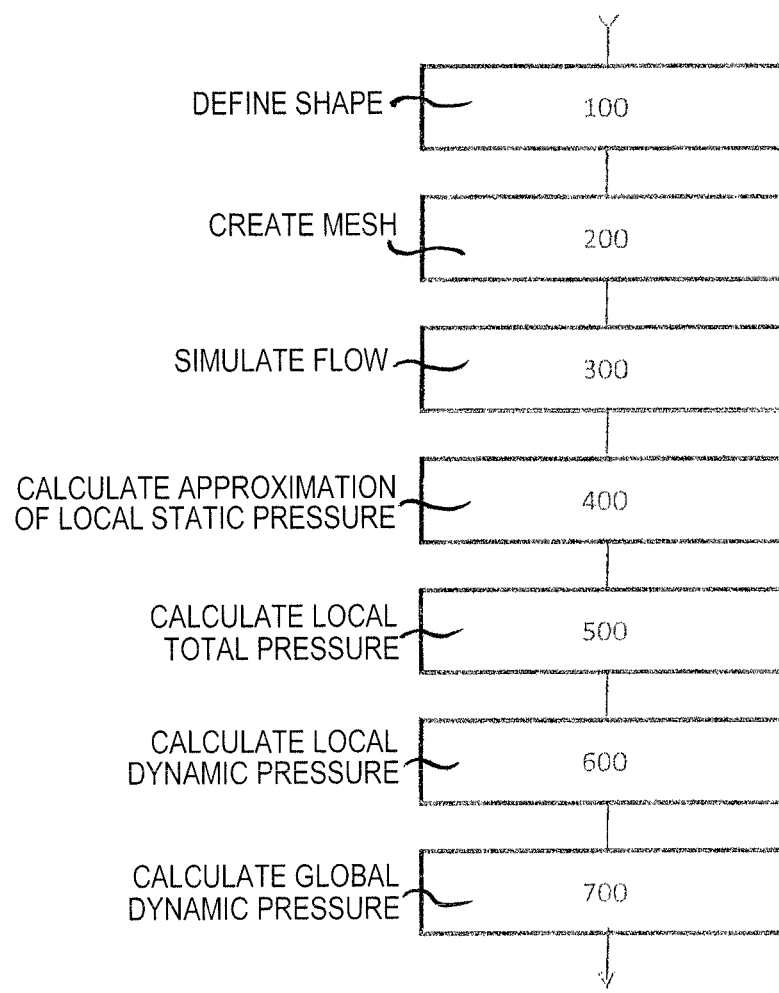

METHOD OF CALCULATING DYNAMIC PRESSURE AT THE LEVEL OF AN AIRCRAFT SURFACE

The present invention pertains to the field of aircraft design methods. It applies to aircraft aerodynamics, more precisely to the characterization by wind tunnel trials or by numerical simulation of the aerodynamic flows around aircraft and to the determination of the aerodynamic coefficients associated with these flows.

It is aimed more particularly at a method of calculating dynamic pressure at the level of a surface such as an aircraft horizontal tailplane.

PREAMBLE AND PRIOR ART

The description of the aerodynamic behaviour of an aircraft is generally crafted in the form of a complex set of equations and tables of values; this set, called an aerodynamic model of the aircraft, makes it possible to provide aerodynamic coefficients (such as for example the lift and drag coefficients) as a function of geometric conditions (such as for example the deflection of the lift-enhancers) and of aerodynamic conditions (such as for example the speed of the aircraft and the density of the air).

The aerodynamic models of the aircraft generally include among their parameters the global dynamic pressure at the level of the horizontal tailplane, denoted QA. This dynamic pressure serves to calculate the aerodynamic loads exerted on this component.

To determine the dynamic pressure QA and according to the current state of the art, the global aerodynamic coefficients of the aircraft are estimated on the basis of wind tunnel trials or of numerical simulations for variable geometric and aerodynamic conditions, by varying in particular the incidence of the flow, denoted a and the trim of the horizontal tailplane iH. The dynamic pressure QA is then defined so as to produce the best match between the aerodynamic model in which it features and these aerodynamic coefficients.

This technique exhibits the major drawback of making it necessary to carry out numerous wind tunnel trials or numerous numerical simulations on account of the necessity to vary the incidence of the flow á and the trim of the horizontal tailplane iH.

Variation of the trim of the horizontal tailplane iH, in particular, generally involves interventions on the mockup and the production of specific meshes. Moreover, in the case of wind tunnel trials, it is generally necessary to add trials without horizontal tailplane. All this involves significant implementation times and costs.

DISCLOSURE OF THE INVENTION

The invention is aimed firstly at a method for simulating the aerodynamic flow around an aircraft, so as to detect the aerodynamic loads exerted on a surface of the said aircraft, the said method comprising a phase of determining a value denoted QA of global dynamic pressure at the level of the said surface.

The method comprises steps:
  of carrying out simulations (for example numerical) of aerodynamic flow around the said surface for given environmental conditions, on the basis of a mesh produced around the shape of the aircraft,
  of determining a local dynamic pressure qA around the surface, and then
  of calculating the global dynamic pressure QA.

In a particular mode of implementation, the surface is a horizontal tailplane, and the carrying out of flow simulations is done for predetermined values of incidence of the flow denoted á and of trim of the horizontal tailplane iH.

This method makes it possible to determine the global dynamic pressure QA without needing to vary á and iH or to consider configurations without horizontal tailplane.

According to a particular implementation, the method comprises steps:
  100: of defining the shape of the aircraft by using computer-aided design (CAD) software,
  200: of creating a mesh around the shape of the aircraft by using mesh creation software.

Advantageously, it also comprises steps:
  300: of carrying out a simulation of the aerodynamic flow around the aircraft, so as to determine in particular a value of the total pressure ptH around the surface under study,
  400: of calculating an approximate value of the local static pressure pA around the surface,
  500: of calculating the local total pressure ptA at any point of the mesh on the surface,
  600: of calculating the local dynamic pressure qA at any point of the mesh on the surface,
  700: of calculating the global dynamic pressure QA in the presence of the aeroplane without the said surface, defined as being that which makes it possible to find the aerodynamic pressure force F exerted on the surface, by a flow which induces the local dynamic pressure qA, calculated in step 600.

In the case where the surface is a horizontal tailplane, the method therefore comprises steps:
  within step 300: of carrying out a numerical simulation of the aerodynamic flow around the aircraft on the basis of the mesh created, so as to determine in particular a value of the total pressure ptH around the horizontal tailplane,
  within step 400: of calculating an approximate value of the local static pressure pA around the tailplane
  within step 500: of calculating the local total pressure ptA at any point of the mesh on the horizontal tailplane,
  within step 600: of calculating the local dynamic pressure qA at all points of the mesh on the horizontal tailplane,
  within step 700: of calculating the global dynamic pressure QA in the presence of the aeroplane without tail, defined as being that which makes it possible to find the aerodynamic pressure force F exerted on the horizontal tailplane, by a flow which induces the local dynamic pressure qA, calculated in step 600.

According to diverse modes of implementation, optionally used in conjunction:
  in step 300 the simulation of the aerodynamic flow around the aircraft is of numerical type, carried out on the basis of the mesh created. Alternatively, this simulation is carried out through wind tunnel trials, the total pressure ptH then being obtained by local probings of the flow, for example by using a multi-hole pressure probe.
  in step 400, the previously determined static pressure at infinity p0 is taken at any point of the mesh of step 200 as value of the local static pressure in the presence of the aeroplane without tail (or more generally without the surface under study) pA.
  in step 500, the value of the total pressure denoted ptH around the horizontal tailplane (or around the surface under study), determined during step 300, is used as approximation of the total pressure without horizontal tailplane (respectively without the surface under study), denoted ptA, for the mesh points situated outside of the boundary layer of the tailplane (or of the surface under study).

in step 600, the local Mach number MA in the presence of the aeroplane without tail (respectively without the surface under study) is calculated on the basis of the local static pressure pA in the presence of the aeroplane without tail (respectively without the surface under study) and of the local total pressure ptA which are determined in steps 400 and 500, by using the isentropic formula:

$$ptA = pA \cdot (1+(\gamma-1)/2 \cdot MA^2)^{\gamma/(\gamma-1)}$$

in which $\gamma$ is the isentropic coefficient.

by inverting this formula to obtain the relation:

$$MA^2 = 2/(\gamma-1) \cdot ((ptA/pA)^{(\gamma-1)/\gamma} - 1)$$

which makes it possible to calculate $MA^2$ by thereafter calculating the local dynamic pressure qA on the basis of the local static pressure in the presence of the aeroplane without tail (respectively without the surface under study) pA and of the local Mach number MA through the formula defining the dynamic pressure:

$$qA = \gamma/2 \cdot pA \cdot MA^2$$

in step 700, the pressure coefficient CpA based on the local dynamic pressure in the presence of the aeroplane without tail (respectively without the surface under study) qA is assumed to be invariant:

$$CpA = ((pH-p0)/qA)$$

in which pH is the local static pressure in the presence of the aeroplane with tail (respectively with the surface under study), the aerodynamic pressure force F is calculated through the formula:

$$F = \int qA \cdot ((pH-p0)/qA) \cdot dS$$

this integral being calculated over the whole of the surface under study, for example the surface of the horizontal tailplane, the global dynamic pressure QA which makes it possible to find this aerodynamic pressure force F exerted on the horizontal tailplane (respectively on the surface under study) is calculated through the formula:

$$\int (1/qA) \cdot ((pH-p0)/q0) \cdot dS = (1/QA) \cdot \int ((pH-p0)/q0) \cdot dS$$

advantageously this vector formula is projected onto a previously chosen axis, both sides of the formula are divided by a reference surface area Sref; and then, by using the formula defining the lift coefficient of the tailplane Cz, the global dynamic pressure QA is calculated through:

$$1/QA = (\int (1/qA) \cdot ((pH-p0)/q0) \cdot (dS \cdot oz)/Sref)/Cz$$

The invention is aimed secondly at a method of designing an aircraft surface, characterized in that the method comprises a method for calculating the aerodynamic loads exerted on the said surface, such as disclosed, and a step of verifying the compatibility of the calculated loads with a predefined specification.

PRESENTATION OF THE FIGURE

The characteristics and advantages of the invention will be better appreciated by virtue of the description which follows, which description discloses the characteristics of the invention through a nonlimiting exemplary application.

The description is supported by the appended FIGURE which represent:

FIG. 1: a flowchart of the steps of an exemplary method according to the invention.

DETAILED DESCRIPTION OF AN EMBODIMENT OF THE INVENTION

The invention is intended to be implemented in software form, by a computer of type known per se.

100: Definition of the Shape of the Aircraft

In this step, the shape of an aircraft is defined using computer-aided design (CAD) software such as that developed by commercial firms and available on the market.

This definition preferably includes a shape simplification sub-step, based on a pre-existing aircraft geometry, so as to remove the elements of the aircraft which a priori have no appreciable aerodynamic effect or positionings of components such as deflections of lift-enhancing devices or control surfaces.

For example, for studying the ground effect on the enhanced-lift configurations of aircraft, it is advantageous to omit the undercarriages since they have a fairly small effect on the ground effect and they cause stability problems in the numerical simulations, related to the unsteady flow present around these undercarriages.

200: Creation of a Mesh

In this step, a mesh is created around the aircraft shape prepared and optionally simplified in the previous step. This mesh is created using mesh creation software such as that developed by research centres or by commercial firms. It may be of structured, unstructured, cartesian, hybrid type or of any other type.

Any mesh is appropriate here, on condition that it makes it possible to satisfactorily simulate the flow around the aircraft and according to the state of the art in numerical aerodynamics.

A structured mesh is preferable for cruising configurations (lift-enhancers retracted) and an unstructured one for low-speed configurations (lift-enhancers deployed). It is understood that such a mesh fills a volume of predetermined dimensions around the shape of the aeroplane under study.

300: Carrying Out of a Numerical Simulation

In this step, a numerical simulation of the aerodynamic flow around the aircraft is carried out on the basis of the mesh created in the previous step, for values of incidence of the flow a and of trim of the horizontal tailplane iH.

The method applies to all the values of a and of iH. In practice, a generally varies between a negative minimum value corresponding to zero lift of the aircraft and a positive maximum a corresponds to the maximum lift achievable by the aircraft (corresponding to the stalling of the aircraft). The parameter iH generally varies between a negative trim corresponding to the minimum lift achievable by the tailplane and a positive trim corresponding to the maximum lift achievable by the tailplane (corresponding to the downward stalling and upward stalling of the tailplane).

This simulation is carried out using numerical aerodynamics software such as that developed by research centres or by commercial firms. It may be of any type, in particular of Euler or Navier-Stokes type, laminar or turbulent or indeed steady or unsteady.

Any simulation is appropriate here, but it may be more or less relevant according to criteria known to the person skilled in the art. A simulation of steady turbulent Navier-Stokes type constitutes a preferential choice.

These first three steps are known per se and are therefore not detailed further above here.

400: Calculation of the Local Static Pressure

In a fourth step, an approximate value of the local static pressure around the tailplane pA is calculated. For simplicity of language, this value pA will be referred to as the "local static pressure" in the subsequent description, although it is a value resulting from intentional simplifying assumptions by the inventors.

Accordingly, it is chosen to consider that the effect of the part of the aeroplane comprising the whole of the aeroplane except the tail, on the flow of the air around the tailplane, pertains essentially to the dynamic pressure, and that its effect on the static pressure is small. This effect results in particular from the wake of the aerofoil and the jets of the engines.

It is therefore chosen to take, at any point of the mesh on the surface of the tailplane, as value of the local static pressure in the presence of the aeroplane without tailplane pA, the static pressure at infinity p0.

This value of static pressure at infinity p0 is assumed to have been determined previously.

500: Calculation of the Local Total Pressure

It is known that, in a perfect fluid flow and in the absence of crossing of shocks, the total pressure is conserved along the streamlines.

It is chosen here to use this property in order to consider that the local total pressure around the horizontal tailplane, denoted ptH, is a good approximation of the local total pressure without horizontal tailplane, denoted ptA, on condition it is outside of the boundary layer of the tailplane. Indeed, in the boundary layer the total pressure varies greatly between the surface of the aircraft and the edge of the boundary layer because of the effects of viscosity and of the condition of adhesion of the air to the wall.

At any point (more precisely at all the points of the mesh on the surface of the tailplane) of the surface of the horizontal tailplane, we therefore move away from this surface (by a distance sufficient to exit the boundary layer; for this purpose use is made of the standard functionalities generally available in numerical simulation codes or in post-processing tools associated with these codes and which allow calculation of the thickness of the boundary layer) perpendicularly to the latter so as to exit the boundary layer, and the value of local total pressure in the presence of the aeroplane with tailplane ptH is charted (for the mesh cells identified as being at the edge of the boundary layer; there is such a cell corresponding to each point of the mesh of the surface of the tailplane).

Use is then made of the relation ptA=ptH which defines a representative value, under these assumptions by the inventors, of the local total pressure in the presence of the aeroplane without tail ptA. For simplicity of language, this value ptA will be referred to as the "local total pressure" in the subsequent description, although it is an approximate value resulting from intentional simplifying assumptions by the inventors.

600: Calculation of the Local Dynamic Pressure

The local Mach number MA in the presence of the aeroplane without tail is then calculated on the basis of the local static pressure pA in the presence of the aeroplane without tail and of the local total pressure ptA that were determined in steps 400 and 500, by using the conventional isentropic formula:

$$ptA = pA \cdot (1+(\gamma-1)/2 \cdot MA^2)^{\gamma/(\gamma-1)}$$

in which $\gamma$ is the isentropic coefficient.

This formula is inverted to give the relation:

$$MA^2 = 2/(\gamma-1) \cdot ((ptA/pA)^{(\gamma-1)/\gamma} - 1)$$

which makes it possible to calculate $MA^2$

The local dynamic pressure qA is thereafter calculated (at all points of the mesh of the surface of the tailplane) on the basis of the local static pressure in the presence of the aeroplane without tail pA and of the local Mach number MA through the formula defining the dynamic pressure:

$$qA = \gamma/2 \cdot pA \cdot MA^2$$

These formulae are known per se to the person skilled in the art.

700: Calculation of the Global Dynamic Pressure

The global dynamic pressure in the presence of the aeroplane without tail QA is defined as being that which makes it possible to find the aerodynamic pressure force F exerted on the horizontal tailplane, by a flow which induces the local dynamic pressure qA, calculated in step 600.

It is chosen here to presuppose that the pressure coefficient CpA based on the local dynamic pressure in the presence of the aeroplane without tail qA is invariant. We have in this case:

$$CpA = ((pH-p0)/qA)$$

in which pH is the local static pressure in the presence of the aeroplane with tail.

The aerodynamic pressure force F is then calculated through the formula:

$$F = \int qA \cdot ((pH-p0)/qA) \cdot dS$$

This integral is calculated (in an approximate manner by discretizing this integral by a finite sum applied to the mesh of the surface of the tailplane) over the whole of the surface of the horizontal tailplane. It should be noted that this formula is a vector formula, F and dS being vectors of dimension 3.

For simplicity of language, this value F will be referred to as the "aerodynamic pressure force" in the subsequent description, although it is an approximate value resulting from intentional simplifying assumptions by the inventors.

Finally, we seek the global dynamic pressure QA which makes it possible to find this aerodynamic pressure force F exerted on the horizontal tailplane, and which must therefore satisfy the formula:

$$F = \int QA \cdot ((pH-p0)/qA) \cdot dS = QA \cdot \int ((pH-p0)/qA) \cdot dS$$

By equating the two expressions for the aerodynamic pressure force F, we obtain the relation:

$$QA \cdot \int ((pH-p0)/qA) \cdot dS = \int qA \cdot ((pH-p0)/qA) \cdot dS$$

This relation is transformed so as to reveal the conventional pressure coefficient Cp0 based on the dynamic pressure at infinity q0 according to the formula:

$$Cp0 = ((pH-p0)/q0)$$

by dividing both sides of this relation by (QA·p0).

We then obtain:

$$\int (1/qA)\cdot((pH-p0)/q0)\cdot dS = (1/QA)\cdot \int ((pH-p0)/q0)\cdot dS$$

Thereafter, it is chosen to project this vector formula onto a previously chosen axis, for example but not limitingly an axis termed the vertical axis oz (substantially perpendicular to the mid-plane of the aeroplane which contains in particular the axis of the fuselage, or, alternatively, perpendicular to the mid-plane of the tailplane) and both sides of the formula are divided by Sref which designates a reference surface area, for example here the surface area of the horizontal tailplane, or, alternatively, the reference surface area of the aerofoil, thereby making it possible to obtain:

$$\int (1/qA)\cdot((pH-p0)/q0)\cdot (dS\cdot oz)/Sref = (1/QA)\cdot \int ((pH-p0)/q0)\cdot (dS\cdot oz)/Sref$$

We then obtain:

$$1/QA = (\int (1/qA)\cdot((pH-p0)/q0)\cdot (dS\cdot oz)/Sref)/(\int ((pH-p0)/q0)\cdot (dS\cdot oz)/Sref)$$

Next, by using the formula defining the lift coefficient of the tailplane Cz, we obtain:

$$1/QA = (\int (1/qA)\cdot((pH-p0)/q0)\cdot (dS\cdot oz)/Sref)/Cz$$

This formula therefore makes it possible to express the inverse of the global dynamic pressure QA as the sum, weighted by the pressure coefficients, of the inverse of the local dynamic pressure qA. We therefore deduce therefrom the value of the global dynamic pressure QA, such as approximated by this formula designed on the basis of the diverse judicious assumptions by the inventors.

Advantages

The invention may be applied for all aerodynamic or geometric conditions, and for all types of aircraft.

The method uses this formula to allow faster design of a tailplane.

It is also aimed at reducing the time and the cost for the evaluation of the global dynamic pressure QA and therefore the time and cost for the formulation of the aerodynamic models and data and, as a consequence, the time and cost for the development of an aeroplane (knowing that this evaluation may be repeated many times during the iterative design loops), for example in a research framework aimed at improving the aerodynamic model as regards ground effect for better reproduction of takeoff manoeuvres.

It may further be used to speed up the fine tuning of the flight controls.

Variants

By way of variants, it is possible to:
carry out wind tunnel trials in place of numerical simulations, the obtaining of the total pressure ptH used in step 500 then being carried out by local probings of the flow, for example by using a multi-hole pressure probe;
apply this method to aircraft components other than the horizontal tailplane, in particular the fin;
in step 700, project onto axes other than the axis oz (in particular onto the axis ox or the axis oy), this variant being necessary in particular when the lift coefficient Cz is zero.

The invention claimed is:

1. A method for simulating aerodynamic flow around an aircraft, so as to determine aerodynamic loads exerted on said aircraft, the loads being dependent on trim of a given structural element of the aircraft, the method determining an aerodynamic model of the aircraft for a plurality of aerodynamic flow scenarios, the method comprising determining the aerodynamic model by determining global dynamic pressure QA exerted around the structural element by a process including the following steps:
   (a) employing a mesh produced around the overall shape of the aircraft,
   (b) simulating the aerodynamic flow around the aircraft by employing said mesh,
   (c) determining local dynamic pressure qA around the surface of said structural element, and
   (d) calculating the global dynamic pressure QA around the surface of the structural element, in the presence of the aeroplane without said structural element, on the basis of the local dynamic pressure qA, wherein the global dynamic pressure QA enables determination of an aerodynamic pressure force F exerted on the overall surface of the structural element.
   (e) generating the aerodynamic model in accordance with steps (a)-(d).

2. The method according to claim 1, further comprising steps prior to said steps (a), (b), (c) and (d):
   determining a value of the total pressure ptH around the surface of the structural element, on the basis of the simulation carried out of the aerodynamic flow around the aircraft,
   calculating an approximate value of the local static pressure pA around the surface of the structural element in the presence of the aircraft without said structural element,
   calculating the local total pressure ptA at any point of the mesh around the surface of the structural element, in the presence of the aircraft without tail; and
   wherein the step (c) of calculating the local dynamic pressure qA at any point of the mesh around the surface of the structural element being carried out on the basis of the values ptH, pA and ptA thus calculated.

3. The method according to claim 1, wherein the structural element comprises a horizontal tailplane, step (b) is carried out for predetermined values of incidence of the aerodynamic flow á and for a given trim iH of the tailplane.

4. The method according to claim 3, wherein in said step of calculating an approximate value of the local static pressure, the static pressure at infinity p0 determined beforehand is taken as value of the local static pressure in the presence of the aeroplane without tail pA at any point of the mesh.

5. The method according to claim 3, wherein in said step of calculating the local total pressure, the value, determined during said step of determining a value of the total pressure, of the total pressure ptH around the horizontal tailplane is used as approximation of the total pressure without tailplane ptA for the mesh points situated outside of the boundary layer of the tailplane.

6. The method according to claim 3, wherein in said step (c), the local Mach number MA in the presence of the aeroplane without tail is calculated on the basis of the local static pressure pA in the presence of the aeroplane without tail and of the local total pressure ptA,
   by using the isentropic formula:

$$ptA = pA\cdot(1+(\gamma-1)/2\cdot MA^2)^{\gamma/(\gamma-1)}$$

in which $\gamma$ is the isentropic coefficient,
   by inverting the isentropic formula to obtain the relation:

$$MA^2 = 2/(\gamma-1)\cdot((ptA/pA)^{(\gamma-1)/\gamma}-1)$$

which makes it possible to calculate $MA^2$ by thereafter calculating the local dynamic pressure qA on the basis of the local static pressure in the presence of the aeroplane without tail pA and of the local Mach number MA through the formula defining the dynamic pressure:

$$qA = \gamma/2 \cdot A \cdot MA^2.$$

7. The method according to claim 3, wherein in said step (d), the pressure coefficient CpA based on the local dynamic pressure in the presence of the aeroplane without tail qA is assumed to be invariant:

$$CpA = ((pH-p0)/qA)$$

in which pH is the local static pressure in the presence of the aeroplane with tail, the aerodynamic pressure force F is calculated through the formula:

$$F = \int qA \cdot ((pH-p0)/qA) \cdot dS,$$

this integral being calculated over the whole of the surface of the horizontal tailplane, the global dynamic pressure QA which makes it possible to find this aerodynamic pressure force F exerted on the tailplane is calculated through the formula:

$$\int (1/qA) \cdot ((pH-p0)/q0) \cdot dS = (1/QA) \cdot \int ((pH-p0)/q0) \cdot dS$$

this vector formula is projected onto a previously chosen axis, both sides of the formula are divided by a reference surface area Sref, and then, by using the formula defining the lift coefficient of the tailplane Cz, the global dynamic pressure QA is calculated through:

$$1/QA = (\int (1/qA) \cdot ((pH-p0)/q0) \cdot (dS \cdot oz)/Sref)/Cz.$$

8. A method of designing an aircraft surface, the method comprising a method for calculating aerodynamic loads exerted on said surface, according to claim 1, and a step of verifying compatibility of the calculated aerodynamic loads with a predefined specification.

\* \* \* \* \*